United States Patent
Ardo et al.

(10) Patent No.: US 9,540,741 B2
(45) Date of Patent: *Jan. 10, 2017

(54) LIGHT-DRIVEN HYDROIODIC ACID SPLITTING FROM SEMICONDUCTIVE FUEL GENERATOR

(71) Applicant: California Institute of Technology, Pasadena, CA (US)

(72) Inventors: Shane Ardo, Irvine, CA (US); Nathan S. Lewis, La Canada Flintridge, CA (US)

(73) Assignee: The California Institute of Technology, Pasadena, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/020,151

(22) Filed: Sep. 6, 2013

(65) Prior Publication Data

US 2014/0061057 A1    Mar. 6, 2014

Related U.S. Application Data

(63) Continuation-in-part of application No. PCT/US2013/035171, filed on Apr. 3, 2013, and a
(Continued)

(51) Int. Cl.
*C25B 9/08* (2006.01)
*C25B 1/02* (2006.01)
(Continued)

(52) U.S. Cl.
CPC .............. *C25B 9/08* (2013.01); *C01B 3/042* (2013.01); *C25B 1/003* (2013.01); *C25B 1/02* (2013.01);
(Continued)

(58) Field of Classification Search
CPC .............. C25B 1/10; C25B 1/003; C25B 1/02; C25B 9/08; H01L 31/035281; H01L 31/078; H01L 31/035227; C01B 3/042; Y02E 70/10; Y02E 60/366; Y02E 60/364; Y02E 10/50; Y02P 20/135
(Continued)

(56) References Cited

U.S. PATENT DOCUMENTS 7,820,022 B2 * 10/2010 McNulty et al. .............. 205/340
8,187,441 B2 * 5/2012 Evans et al. .................. 204/518
(Continued)

FOREIGN PATENT DOCUMENTS

JP      2006-089336        *   4/2006
WO      2007084796 A2          7/2007
WO      2010117339 A1         10/2010

OTHER PUBLICATIONS

Ueda et al, "Efficient Solar to Chemical Conversion with an n-Type Amorphous Silicon/p-Type Crystalline Silicon Heterojunction Electrode," Chem. Lett. 1987, pp. 747-750.*
(Continued)

*Primary Examiner* — Keith Hendricks
*Assistant Examiner* — Colleen M Raphael
(74) *Attorney, Agent, or Firm* — Joseph R. Baker, Jr.; Gavrilovich, Dodd & Lindsey LLP

(57) ABSTRACT

This disclosure relates to photovoltaic and photoelectrosynthetic cells, devices, methods of making and using the same.

10 Claims, 4 Drawing Sheets

Related U.S. Application Data continuation-in-part of application No. 13/856,353, filed on Apr. 3, 2013.

(60) Provisional application No. 61/697,422, filed on Sep. 6, 2012.

(51) Int. Cl.
| | | |
|---|---|---|
| *C01B 3/04* | (2006.01) | |
| *C25B 1/00* | (2006.01) | |
| *H01L 31/0352* | (2006.01) | |
| *H01L 31/078* | (2012.01) | |
| *C25B 1/10* | (2006.01) | |

(52) U.S. Cl.
CPC ......... *C25B 1/10* (2013.01); *H01L 31/035227* (2013.01); *H01L 31/035281* (2013.01); *H01L 31/078* (2013.01); *Y02E 10/50* (2013.01); *Y02E 60/364* (2013.01); *Y02E 60/366* (2013.01); *Y02E 70/10* (2013.01); *Y02P 20/135* (2015.11)

(58) Field of Classification Search
USPC . 204/157.48, 157.52; 422/186–187; 205/340
See application file for complete search history.

(56) References Cited

U.S. PATENT DOCUMENTS

| | | | |
|---|---|---|---|
| 2005/0025680 A1* | 2/2005 | Monzyk et al. | 422/186 |
| 2006/0207883 A1* | 9/2006 | Koval et al. | 204/518 |
| 2006/0266642 A1 | 11/2006 | Akle et al. | |
| 2009/0035908 A1 | 2/2009 | Pribat et al. | |
| 2009/0321244 A1* | 12/2009 | Smith et al. | 204/157.52 |
| 2011/0100411 A1 | 5/2011 | Lagally et al. | |
| 2014/0038074 A1* | 2/2014 | Marsh | 204/230.2 |
| 2014/0120000 A1* | 5/2014 | Yoon | 422/162 |

OTHER PUBLICATIONS

Levy-Clement et al, "Spontaneous Photoelectrolysis of HBr and HI," J. Electrochem. Soc. vol. 129, No. 8, pp. 1701-1705.*

Tosti et al, "Study of a dense metal membrane reactor for hydrogen separation from hydroiodic acid decomposition," Int'l J. of Hydrogen Energy, vol. 33 (2008) pp. 5106-5114.*

Yan et al, "A novel dual-bed photocatalytic water splitting system for hydrogen production," Int'l J. of Hydrogen Energy, vol. 36 (20110 pp. 7405-7409.*

Kim, Do Weon, International Search Report and Written Opinion, PCT/US2013/058475, Korean Intellectual Property Office, Dec. 16, 2013.

Baharlou, Simin, International Preliminary Report on Patentability and Written Opinion, PCT/US2013/058475, The International Bureau of WIPO, Mar. 19, 2015.

* cited by examiner

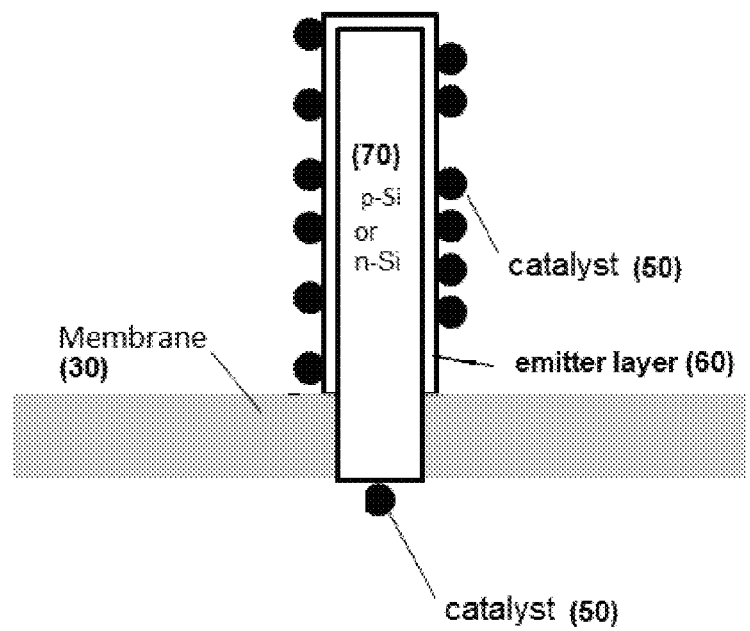
FIGURE 1C
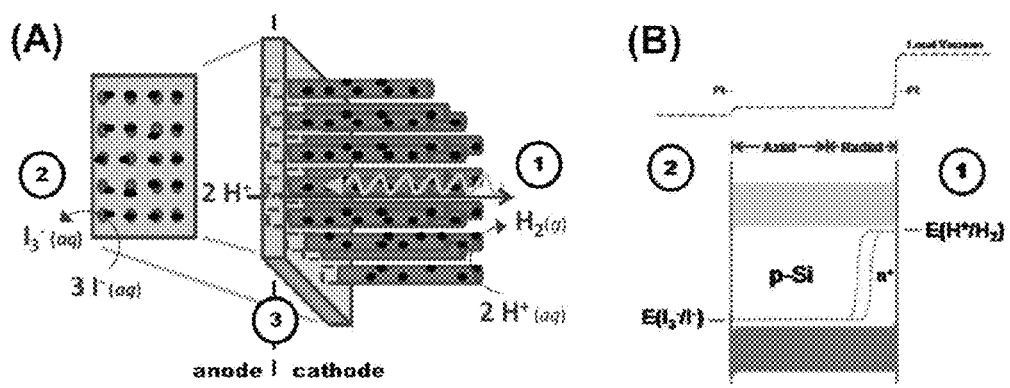
FIGURE 2A-B

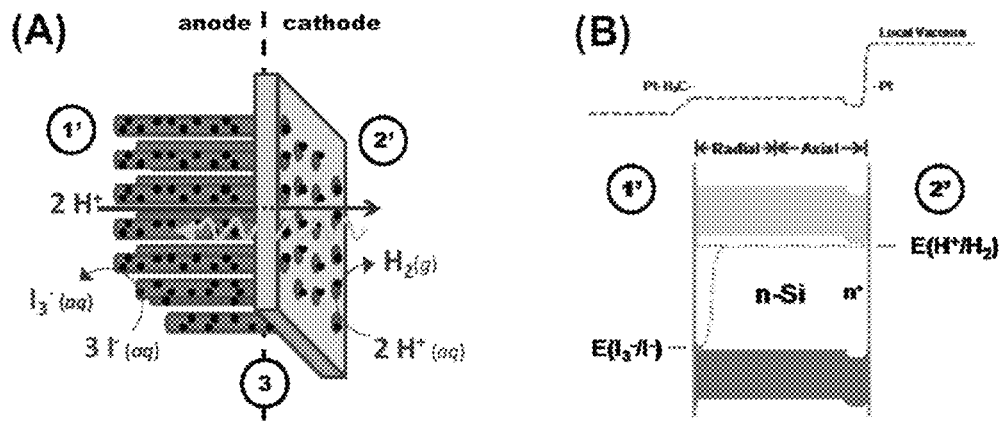
FIGURE 3A-B
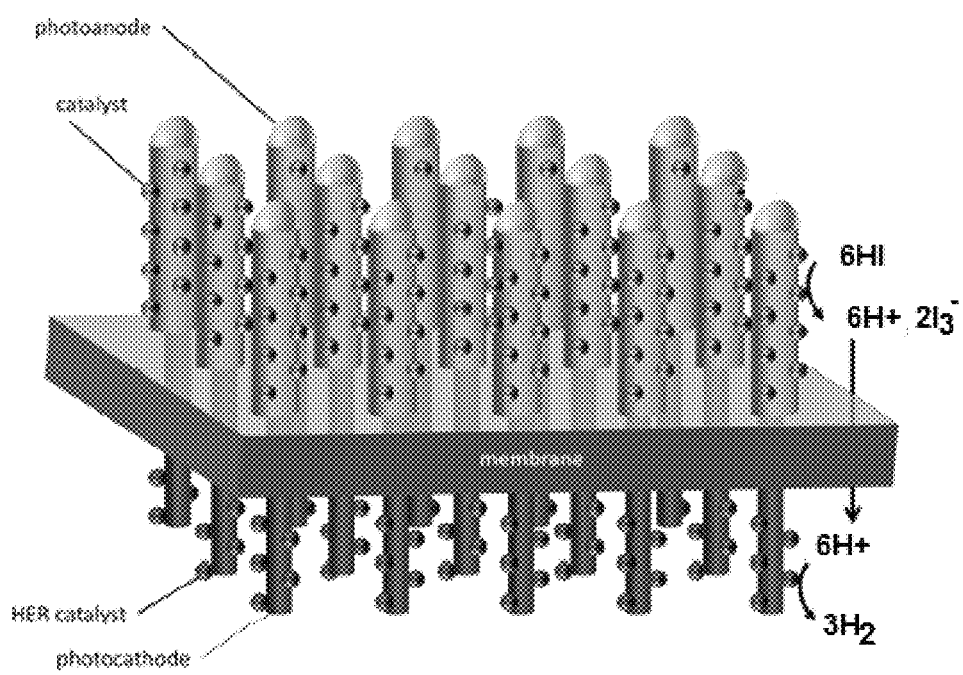
FIGURE 4

US 9,540,741 B2

LIGHT-DRIVEN HYDROIODIC ACID SPLITTING FROM SEMICONDUCTIVE FUEL GENERATOR

CROSS REFERENCE TO RELATED APPLICATIONS

This application claims priority to U.S. Provisional Application Ser. No. 61/697,422, filed Sep. 6, 2012; and is a continuation-in-part of International Application No. PCT/US2013/035171, filed Apr. 3, 2013 and U.S. application Ser. No. 13/856,353, filed Apr. 3, 2013, the disclosures of which are incorporated herein by reference.

STATEMENT REGARDING FEDERALLY SPONSORED RESEARCH

This invention was made with government support under Grant Nos. DE-FG02-05ER15754/T-105906 and DE-SC0004993 awarded by the Department of Energy. The government has certain rights in the invention.

TECHNICAL FIELD

This invention relates to photovoltaic cells, devices, acid splitting devices and methods of making and using the same.

BACKGROUND

Ordered arrays of crystalline-Si (c-Si) microwires, fabricated by chemical-vapor-deposition, vapor-liquid-solid (CVD-VLS) growth mechanism, were pioneered nearly five years ago for sunlight-to-electrical power conversion. P-type Si microwire arrays, employing a thin $n^+$-doped emitter layer to form a buried junction ($p$-$n^+$-Si), have since realized sunlight-to-electrical power-conversion efficiencies >7% from solid-state photovoltaic (PV) devices, and >5% power-conversion efficiency toward $H_2$ evolution from acidic aqueous electrolytes when functionalized with Pt electrocatalysts. In the absence of additional processing-intensive steps for light absorption enhancement, these devices demonstrated a short-circuit (maximum) current density ($j_{sc}$)≈9 mA/cm$^2$, open-circuit (maximum) photovoltage ($V_{oc}$)≈0.53 V, and fill factor≈70%. The product of these three terms determines the power-conversion efficiency of the device. The Si microwire geometry uses ~5% of the material required for conventional wafer-based photovoltaics (PVs) and absorbs ~20% of above bandgap sunlight. Various designs to alter the path of light and increase absorption by the Si microwire arrays, and thus $j_{sc}$ and the efficiency, have been investigated with modest success.

Si microwire array photocathodes have been shown to generate photovoltages in excess of 500 mV in acidic aqueous environments, and provide a desirable geometry, relative to planar structures, for devices that effect the unassisted generation of fuels from sunlight. Microwire arrays benefit from orthogonalization of the directions of light absorption and minority-carrier collection, as well as from light-trapping effects, an increased surface area for catalyst loading per unit of geometric area, a small solution resistance as compared to planar designs, a reduced material usage through reusable substrates; and from the ability to embed the microwires into ion exchange membranes that exhibit little permeability to $H_2$ and $O_2$, thereby producing flexible devices that persistently separate the products of the water-splitting reaction.

However, the voltage generated from single-junction Si microwire arrays is much lower than the 1.23 V required for solar-driven water splitting.

SUMMARY

A free-standing, photoelectrosynthetic device for sunlight-driven hydroiodic acid splitting is described. In one embodiment, the device has a single-junction microwire array decorated with electrocatalysts and embedded in an ionomer membrane.

The disclosure provides a device, system and method device for generating hydrogen gas. The device comprises a chamber compartmentalized to have a first subchamber/cell and a second subchamber/cell; an ionomer membrane sealably separating the first subchamber/cell and second subchamber/cell; a plurality of elongated structures comprising a semiconductive material extending through the ionomer membrane and having the following parameter(s): a band-gap energy of about 0.80 to 1.90 eV; and catalyst disposed on the surface of the elongated structures in the first subchamber, wherein the catalyst on the elongated structure performs one of the following two half reactions: $2H^++2e^-\rightarrow H_2$, or $3I^-\rightarrow I_3^-+2e^-$, catalyst disposed on the backside of the elongated structures in the second subchamber, wherein the catalyst on the backside of the elongated structure performs a different half-reaction from the following two half reactions: $3I^-\rightarrow I_3^-+2e^-$, or $2H^++2e^-\rightarrow H_2$, when exposed to light. In one embodiment, the plurality of elongated structures comprise a p-type Si core and an $n^+$ emitter layer. In another embodiment, the plurality of elongated structures comprise an n-type Si core. In a further embodiment, the elongated structures have (i) a surface methyl group and a bottom $n^+$ region; or (ii) a $p^+$ emitter layer and a bottom $n^+$ region. In another embodiment, the plurality of elongated structures comprise an undoped Si core. In a further embodiment, the elongated structures have (i) a surface methyl group and a bottom $n^+$ region; (ii) a $p^+$ emitter layer and a bottom $n^+$ region; or (iii) an $n^+$ emitter layer and a bottom $p^+$ region. In yet another embodiment, of any of the foregoing, the potential of an HI solution is varied from 150 mV to 950 mV through dilution of fuming aqueous HI, addition of various concentrations of $I_2$ to the solution, and/or adding iodide salt or another acid source to dilute HI solution. In yet another embodiment, of any of the foregoing, the elongated structure has a dimension comprising 500 nm to about 5 micrometers in diameter and about 1 micrometer to 1 mm in length or wherein the elongated structure has a mean diameter less than 1 micrometer and a length of less than 1 micrometer and an aspect ratio of greater than 1. In yet another embodiment, of any of the foregoing, the elongated structure has an aspect ratio greater than 1. In yet another embodiment, of any of the foregoing, the semiconductive material is Si. In yet another embodiment, of any of the foregoing, the elongated structure is substantially embedded in a material comprising an ionomer material. In a further embodiment, the material forms the ionomer membrane comprising the elongated structure embedded in the material extending from and/or through a first surface to and/or through a second surface of the membrane. In yet another embodiment, of any of the foregoing, one or both ends of the elongated structure are coated with a catalyst. In yet another embodiment, of any of the foregoing, the catalyst is Pt. In one embodiment, the elongated member further comprises an oppositely doped emitter layer. In a specific embodiment, the device comprises Si microwires embedded in the ionomer membrane, wherein the Si microwires are doped or undoped and are coated with a Pt catalyst on both sides of the ionomer membrane.

The disclosure also provide a method of generating $H_2$ from HI comprising contacting any of the devices described herein with HI under illumination.

BRIEF DESCRIPTION OF THE DRAWINGS

FIG. 1A-C depicts a unit cell of a PEC device of the disclosure.

FIG. 2A-B show a schematic and potential band diagrams of a device of the disclosure (A) A proposed device design with (1) p-type silicon microwires (rods) with platinum cathodic electrocatalysts (black dots on silicon microwire sidewalls), (2) flipped over and blown-up inset of the backsides of silicon microwires (dots) with platinum anodic electrocatalysts (black dots on silicon microwire backsides), and (3) Nafion proton-exchange membrane (separator). Light is indicated by the curved wiggle line and the resulting photo-driven reactions are shown as straight lines. (B) The potential band diagram of the device shown in panel A.

FIG. 3A-B shows alternative device schematic and potential band diagrams. (A) An alternative proposed device design with (1) n-type silicon microwires (rods) with platinum anodic electrocatalysts (black dots on silicon microwire sidewalls), (2) the backsides of silicon microwires (dots) with platinum cathodic electrocatalysts (black dots on silicon microwire backsides), and 3) Nafion proton-exchange membrane (separator). Light is indicated by the curved wiggle line and the resulting photo-driven reactions are shown as straight lines. (B) The potential band diagram of the device shown in panel A for microwires methylated on their sidewalls and tops and with back-surface fields at their backsides.

FIG. 4 depicts an integrated membrane PEC system for $H_2$ generation from HI.

DETAILED DESCRIPTION

Figure 1A:
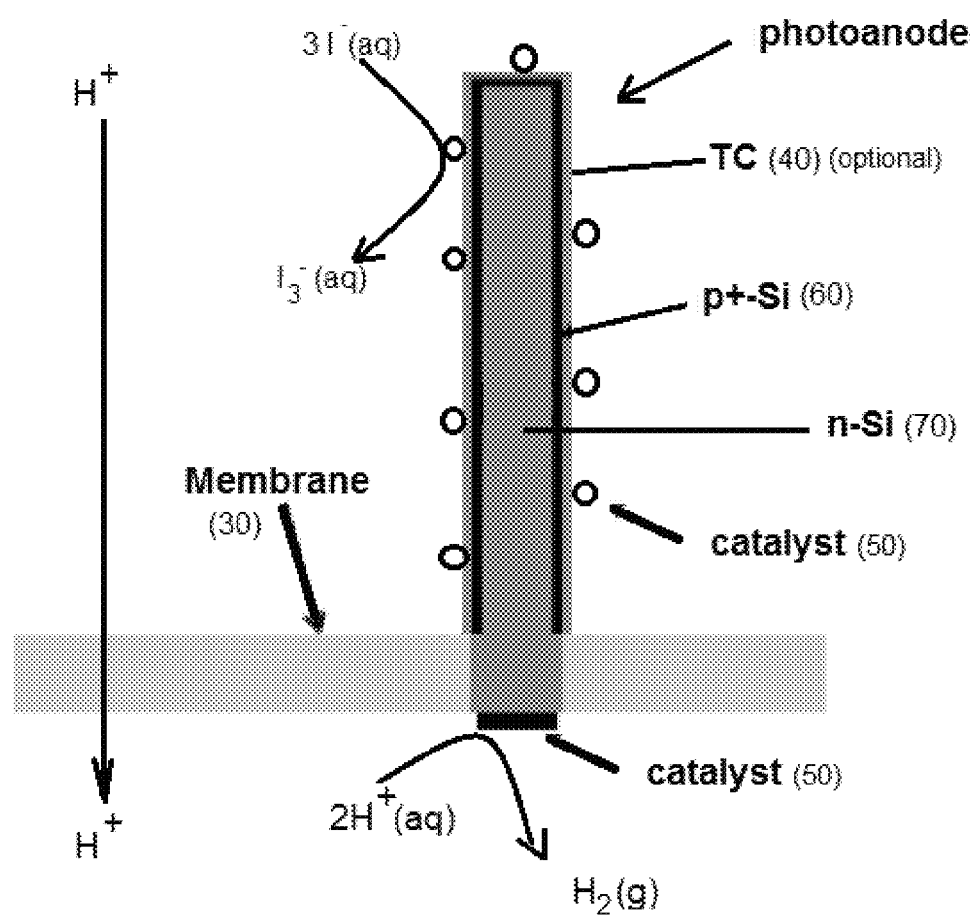

As used herein and in the appended claims, the singular forms "a," "and," and "the" include plural referents unless the context clearly dictates otherwise. Thus, for example, reference to "a pillar" includes a plurality of such pillars and reference to "the catalyst" includes reference to one or more catalysts known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

By "about" is meant a quantity, level, value, number, frequency, percentage, dimension, size, amount, weight or length that varies by as much as 30, 25, 20, 15, 10, 9, 8, 7, 6, 5, 4, 3, 2 or 1% to a reference quantity, level, value, number, frequency, percentage, dimension, size, amount, weight or length. With respect to ranges of values, the disclosure encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

The term "array" generally refers to multiple numbers of structures distributed within an area and spaced apart, although possible touching in some places, unless otherwise indicated. Structures within an array all do not have to have the same orientation.

The term "aspect ratio" refers to the ratio of a structure's length to its width. Hence, the aspect ratios of the elongate structures will be greater than one. Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. In various embodiments, the diameter of, for example, a "rod" or "wire" is about 10-50 nm, about 50-100 nm, about 100-500 nm, about 500 nm-1 µm, about 1 µm-10 µm or about 10µ-100 µm. Typically the diameter will be about 1-10 µm. The length of the "rod" or "wire" is about 1 µm-10 µm, about 10 µm-100 µm, or about 100 µm-several millimeters.

The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity.

As used herein, "elongated structure" refers to a structure having an aspect ratio greater than 1 wherein the structure can be uniform or non-uniform along its axis. For example, the elongated structure can be conical, hour-glass, an inverted conical, and the like. The elongated structure has one axis that is longer than a perpendicular axis. The longer axis can be several to about 999 nm in length (e.g., a nano-elongated structure), or may be a micron to 999 microns in length or longer (e.g., micro-elongated structures).

The terms "ordered" or "well-defined" generally refer to the placement of elements in a specified or predetermined pattern where the elements have distinct spatial relationships to one another. Hence, the terms "ordered array" or "well-defined" generally refer to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings. The structures within "ordered" or "well-defined" arrays may also have similar orientations with respect to each other.

A "photovoltaic cell" is an electrical device comprising a semiconductor that converts light or other radiant energy, in the range from ultraviolet to infrared radiation, incident on its surface into electrical energy in the form of power/voltage/current and which has two electrodes, usually at least one diode where the diode has a top electrode and a bottom electrode with opposite electrical polarities. The photovoltaic cell produces direct current which flows through the electrodes. As employed herein, the term photovoltaic cell is generic to cells which convert radiant energy into electrical energy. A solar cell is a photocell that converts light including solar radiation incident on its surface into electrical energy.

A photovoltaic ("PV") cell may be connected in parallel, in series, or a combination thereof with other such cells. A common PV cell is a p-n junction device based on crystalline silicon. In various embodiments of the disclosure a PV cell comprises p-n junction devices of silicon elongated structure. In other embodiments a PV cell comprises a plurality of silicon p-n junctions. Other types of PV cells can be based on a p-n junction cell of silicon and other semiconductive materials, such as, but not limited to, amorphous silicon, polycrystalline silicon, germanium, organic materials, Group III-V semiconductor materials, such as gallium arsenide (GaAs), Group II-VI semiconductor materials, such as cadmium sulfide (CdS), metal oxides, nitrides, or chalcogenides, such as zinc oxide, and mixed ternary, and larger number component, materials.

During operation of a photovoltaic cell, incident solar or light radiation penetrates below a surface of the PV cell and is absorbed. The depth at which the solar radiation penetrates depends upon an absorption coefficient of the cell. In the case of a PV cell based on silicon, an absorption coefficient of silicon varies with wavelength of solar radiation. At a particular depth within the PV cell, absorption of solar radiation produces charge carriers in the form of electron-hole pairs. Electrons flow through one electrode connected to the cell, while holes exit through another electrode connected to the cell. The effect is a flow of an electric current through the cell driven by incident solar radiation. Inefficiencies exist in current solar cells due to the inability to collect/use and convert the entire incident light.

Also, in accordance with a junction design of a PV cell, charge separation of electron-hole pairs is typically confined to a depletion region, which can be limited to a thickness of about 1 μm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a longer wavelength. In particular, since the longer wavelength solar radiation can penetrate below the surface to a greater degree, electron-hole pairs that are produced can be too far from the depletion region to contribute to an electric current.

A photoelectrochemical (PEC) cell is a PV cell immersed in an electrolyte to impart electrochemical reactions at its surfaces. It is generally equivalent to electrically connecting a PV cell to two electrodes immersed in an electrolyte such that the electrochemical reactions are directly driven by the electricity generated by the PV. A photoelectrosynthetic (PES) cell is one where the net reactions being driven by the PV cell are thermodynamically unfavorable and thus require the free energy of the PV to perform the reactions. There are two electrochemical reactions, termed half-reactions, that occur, one at each electrode, to result in an overall balanced chemical reaction, such as the water splitting reaction which is $2H_2O \rightarrow 2H_2 + O_2$.

N/P junction (or p-n or n-p) refers to a connection between a p-type semiconductor and an n-type semiconductor which produces a diode. Depletion region refers to the transition region between an n-type region and a p-type region of an N/P junction where a large electric field exists.

Electromagnetic Radiation to Electric Energy Conversion Device (EREECD) is a device that reacts with electromagnetic (optical) radiation to produce electrical energy. Optoelectronic Energy Device (OED) refers to a device that reacts with optical radiation to produce electrical energy with an electronic device. As used herein, the term "ultraviolet range" refers to a range of wavelengths from about 5 nm to about 400 nm. As used herein, the term "visible range" refers to a range of wavelengths from about 400 nm to about 700 nm. As used herein, the term "infrared range" refers to a range of wavelengths from about 700 nm to about 2 mm. The infrared range includes the "near infrared range," which refers to a range of wavelengths from about 700 nm to about 5 μm, the "middle infrared range," which refers to a range of wavelengths from about 5 μm to about 30 μm, and the "far infrared range," which refers to a range of wavelengths from about 30 μm to about 2 mm.

Within this description, the term "semiconductive material", "semiconductor" or "semiconducting substrate" and the like is generally used to refer to elements, structures, or devices, etc. comprising materials that have semiconductive properties, unless otherwise indicated. Such materials include, but are not limited to: materials including elements from Group IV of the periodic table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconducting structure" refers to a structure comprising, at least in part, a semiconducting material. A semiconducting structure may comprise either doped or undoped material. As described herein, the "core" or first semiconductive material can be any semiconductive material. In certain embodiments, the "core" is a Si material.

Further the term "vertical" with reference to elongated structures, wires, rods, whiskers, pillars, etc., generally refers to structures that have a length direction that is elevated somewhat from horizontal.

The term "vertical alignment" generally refers to an alignment or orientation of a structure or structures that is elevated from horizontal. The structure or structures do not have to be completely normal to horizontal to be considered to have a vertical alignment.

The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal.

The term "wider band-gap" refers to the difference in band-gaps between a first material and a second material. "Band-gap" or "energy band gap" refers to the characteristic energy profile of a semiconductor that determines its electrical performance, current and voltage output, which is the difference in energy between the valence band maximum and the conduction band minimum. For example, in one embodiment, reference to an elongated structure coated with a material having a "wider band-gap material" refers to a material having a wider band-gap than the elongated structure's material. To drive the water splitting reaction at reasonable overpotentials, ideally the core semiconductive material has a bandgap energy of about 1.1 eV and the outer/radial semiconductive material has an eV of about 1.7 eV.

Integrated solar fuels generation devices are of interest to provide chemical energy sources rather than purely electrical energy. In other words, solar cells convert light energy to electrical energy that can be stored or used directly. However, other means to store light energy look to convert the light energy into chemical energy through splitting various chemicals to produce $H_2$. Optimization of various aspects of the components including the semiconductive material, geometry, membranes and flow systems are needed.

Photoelectrosynthetic fuel-forming devices transduce the energy in sunlight to chemical bonds via two electrochemical half-reactions, whose free energy difference is endergonic (i.e. thermodynamically unfavorable). Traditional embodiments of photoelectrosynthesis employ the water splitting reaction, equation (1), or an alternative reaction where $CO_2$ is also a reactant to accept electrons and protons.

$$2H_2O \rightarrow O_2 + 2H_2 \quad \Delta E° = -1.23 \text{ V} \qquad (1)$$

For these reactions, water is the electron source, although there are a variety of other reversible electron sources for $H_2$ evolution (e.g., $H_2S$, $H_2Se$, $H_2Te$, HI, HBr, HCl, HF, $NH_3$, waste water, and pollutants). Specifically, iodide from hydroiodic acid (HI) requires a smaller photopotential than water for spontaneous evolution of $H_2$, via the hydroiodic-acid-splitting reaction, equation (2).

$$6HI \rightarrow 2I_3^- + 3H_2 \quad \Delta E° = -0.54 \text{ V} \qquad (2)$$

The potential of this reaction can be increased or decreased ~400 mV by solely varying the concentration of HI. Increasing the concentration of HI toward the fuming, reverse azeotropic state and/or decreasing the concentration of $I_2/I_3^-$ decreases the potential required to split HI, making the reaction less endergonic. Alternatively, increasing the pH and pI ($-\log([I^-])$), through, for example, HI dilution, increases the potential required to split HI. This affords great flexibility in the choice of semiconductor used to drive this reaction, because the potential of the fuel-forming reactions in solution can be tuned to match the photovoltage generated from the chosen semiconductor, as long as it is in the range of ~150-950 mV.

The semiconductor bandgap energy, that results in the largest light-to-electrical power-conversion efficiency for a single-junction photovoltaic under the detailed-balance limit, is about 1.1-1.5 eV. For this reason, most materials employed in single-junction commercial photovoltaics possess bandgaps in this range. Although the bandgap potential difference often exceeds that required to perform the water splitting reaction at standard state, equation (1), the maximum reported photovoltages ($V_{oc}$s) are insufficient (~1.1 V, and generally ~800 mV, due to unavoidable entropic losses).

For maximum power conversion to electricity or chemical fuels, the $V_{oc}$ condition is inadequate as photocurrent must also be generated simultaneously with photovoltage to generate power. Maximum power is converted to electricity or chemical fuels when the product of the photovoltage and photocurrent is largest, and this occurs at what is termed the maximum power point. Thus, the photovoltage that generates the largest light-to-electrical powerconversion efficiency is generally 0.63-1.03 V, which nearly coincides with the practical range of potentials possible for HI splitting (e.g., about 150-950 mV). This provides support for driving the HI splitting reactions with sunlight from well-studied semiconducting materials that are already produced on a relatively large, commercial scale.

Catalytic overpotentials must also be taken into consideration when matching the photovoltage of a semiconductor with that of a fuel. Any catalytic overpotential is an energy penalty that ultimately results in liberation of heat in exchange for more rapid catalysis and larger currents. The redox reaction involving iodide that forms a stable reaction product is a two-electron-transfer oxidation to form iodine, and through association with iodide, triiodide, whereas for complete water oxidation a four-electron-transfer oxidation to $O_2$ is required. Reactions requiring the transfer of fewer charges are often more facile and require less activity from the catalysts. The iodide to iodine/triiodide redox chemistry occurs efficiently using various catalytic materials (e.g., Pt, Ir, metal-carbides, organic materials, and the like) suggesting that small amounts of electrocatalyst materials will be required. Even in such cases, cathodic and anodic overpotentials summing to at least 50-100 mV at substantial solar-relevant currents, benchmarked at 10 $mA/cm^2$. This implies that the desired fuel potential lies in the range of about 530-980 mV, further supporting HI splitting from the above materials (i.e. semiconductors and catalysts).

Light absorption and minority carrier collection occur on the same coordinate in planar photovoltaics, which requires that the collection length match or exceed the absorption length and thus necessitates high-purity material. The microwire geometry, as described more fully below, provides a carrier-collection advantage through orthogonalization of the light-absorption (long axial dimension) and minority-carrier-collection (short radial dimension) axes. Thus, microwires require less semiconductor material, per unit projected area, and lower purity semiconductor material than planar devices. These are both advantageous for commercial applications.

The microwire-array geometry is advantageous not only when compared to planar semiconductors, but nanostructured ones as well. The term "microwire-array geometry" implies that the depletion width of the semiconductor sets a lower bound for the microwire radius; device performance suffers when the depletion width is greater than the microwire radius. Typical values of the depletion width are 150-300 nm and thus the overall microwire diameter is typically greater than about 0.3-0.6 μm. Surface structuring and alternative geometries can be designed that result in advantageous performance parameters (e.g., cones, rectangles, pyramids, inverse opals, spheres, elipsoids, branched wires, horn, dual radii wires, blobs etc.).

Dark current dictates the maximum photovoltage possible from photoelectrochemical devices. As dark current scales with semiconductor junction area, microwires whose diameters are too small suffer from exorbitant losses in photovoltage; world-record efficiencies from microwire devices suggest that geometric-to-projected areas of ~10 are acceptable and only result in losses of 65-90 mV, assuming diode-quality factors of 1.1-1.5. Thus, after taking these losses into consideration, on top of the ones already covered above, the fuel potential should be in the range 440-920 mV, again, further supporting HI splitting from these materials and geometries.

Not only do microwires support full space-charge regions, ensuring a large photovoltage, but they provide rather unimpeded micron-scale solution diffusion/drift pathways in-between their solid structures. Ionically conductive polymers can be spin coated between the microwires and mechanical peeling results in free-standing devices that are flexible on the micron scale and greatly attenuate product crossover, resulting in a <1% net loss of reaction products. The array geometry, partially infilled with an ionomer, also ensures insignificant ohmic potential losses (i.e. <10 mV) due to solution resistance. Ions only need to travel on the order of microns to satisfy charge neutrality with the electronic charge separated in the semiconductor or electronic charge bound as chemical bonds in the reaction products.

The disclosure provides devices for use in $H_2$ production comprising various embodiments as follows. Embodiments of the disclosure generally comprise elongated structures comprising one or more of p-n junctions. In one embodiment, an elongated structure of the disclosure comprises at least two p-n junctions. In another embodiment, the elongated structure comprises 3 or more p-n junctions. A multijunction (sometimes referred to as a tandem junction) device consisting of at least one semiconductive (e.g., Si) elongated structure array and another photopotential generating junction connected in series can be used in certain designs to increase efficiency and the maximum photopotential, i.e. $V_{oc}$. This can be used for photoelectrosynthetic systems, where the energy in sunlight is directly converted into chemical fuel. For example, in some instances potentials larger than the $V_{oc}$ of a single Si elongated structure array are required for splitting of various feeds, e.g. $H_2/Br_3^-$ from HBr; $H_2/Cl_2$ from HCl; $H_2/O_2$ from $H_2O$, and other reactions where the reduced species contains hydrocarbon and the precursor is $CO_2$ or carbonic acid or its salts or $N_2$ or nitrates/nitrities are reduced to amines.

In a more specific embodiment, however, the disclosure provides an array of elongated structures comprising Si and having an oppositely doped emitter layer and platinum catalysts disposed in contact with the elongated structure. For example, in one embodiment, the disclosure provides a Si microwire array with a thin emitter layer deposited on the Si microwire. For example, n-type Si (n-Si) elongated structure arrays are fabricated as described more thoroughly below. A buried-junction can be fabricated as a thin $p^+$ emitter layer (n-$p^+$-Si), using, for example, a boron-nitride/-oxide thermal diffusion source wafer or spin-on dopants glass. The elongated structures (e.g., wires) serve as the anode (see, e.g., FIGS. 1A and 3A). Although not necessary, a protective conductive layer may be further disposed on the elongated structures. In certain embodiments, a layer of transparent conductive material can be layered onto the surface of the n-$p^+$-Si. In yet still further embodiments, a second radially-integrated hetero semiconductive material having a different band gap than the underlying core n-Si material can be added. For example, low-temperature plasma-enhanced CVD (PECVD), hot-wire CVD (HW-CVD), and/or magnetron sputtering can be employed to deposit a thing a-$p^+$-Si layer 9<100 nm). This would result in two p-n junctions connected both optically and electrically in series.

Figure 1B:
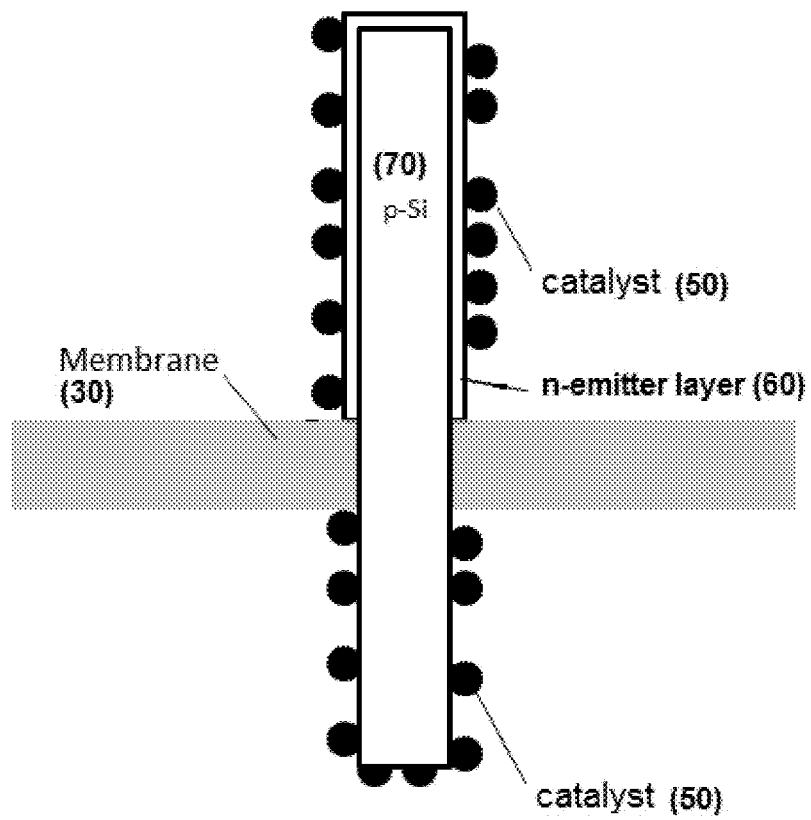

FIG. 1A-C further depicts an example of a unit cell of the photoelectrochemical (PEC) device of the disclosure, with one embodiment having rotational symmetry around the vertical axis in the plane of the page. Each elongated structure (70) comprises a semiconductive material. In the case of FIG. 1A, the elongated structure 70 is depicted as being an n-Si material, while in FIG. 1B the elongated structure is depicted as being a p-Si material. It will thus be readily apparent to one of skill in the art, that depending upon whether the structure is to serve as an anode or cathode the semiconductive material can be n-Si or p-Si, respectively. Similarly, an emitter layer 60 will have an opposite doping to the elongated structure. In FIG. 1A, the emitter layer is depicted as being a $p^+$ dopant, however, one of skill in the art will recognize that if the elongated structure 70 is p-Si, then the emitter layer 60 will be an n-dopant. In some embodiments, where a tandem or multijunction wire array is desired, the elongated structure may optionally comprise a transparent conductive layer 40 (not depicted in FIG. 1B or 1C). In such instances, the semiconductors are arranged electrically and optically in series through the transparent conductor 40. In one embodiment, the conductor is transparent. In this embodiment, the transparency affords maximum absorption of sunlight by the underlying core semiconductor 70. The transparent conductive material can be, for example, any transparent conductive oxide (TCO) that provides a low resistance radial sheath. Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Other conductors include, for example, AZO, GZO, ITO:ZnO, ITO:Ti, $In_2O_3$, $In_2O_3$:M (M=Ti, Mo, Ga, W, Zr, Nb), BZO, $Al_2O_3$, MnO, MgO, and Graphene.

Absorption of photons generates energetic electron-hole pairs that affect fuel forming chemical reactions at semiconductor-anchored catalysts 50 in intimate contact with an electrolyte solution (e.g., HI). One embodiment entails a macroscopic device formed as a two-dimensional periodic array of microwires having catalysts thereon. The periodic array geometry provides increased light absorption over conventional planar devices, per mass of material, which improves energy production.

Also depicted in FIG. 1A is a membrane 30. The membrane can be any ionomer membrane/proton exchange membrane. The membrane will typically be disposed in a chamber to separate the chamber into two subchambers of cells. The membrane serves to keep the reactants separated while allowing protons to traverse the membrane. In the photoanode depiction of FIG. 1A, the first half reaction occurs in a cell/subchamber at the elongated structures comprising the catalyst and the second occurs at the catalyst on the opposing side of the membrane 30 in cell/subchamber different from the first cell/subchamber.

During operation, illumination, for example, produces photoexcited majority-carrier electrons in the n-Si core, which are transported axially to the back contact to perform the hydrogen-evolution reaction at a catalyst on the counter electrode, or on the backsides of peeled, freestanding elongated structural arrays, while photoexcited minority-carrier holes are collected radially in the $p^+$-Si sheath.

In FIG. 1A, the Si elongated structure of the core can be moderately doped n-type ($N_d=10^{16}$-$10^{18}$ $cm^{-3}$) with a thin, degenerately doped p-type emitter ($N_a>10^{18}$ $cm^{-3}$) radial sheath, forming an n-type|p-type (p-n) junction. These doping densities set a lower bound on the wire radius as device performance suffers when the depletion width is greater than the radius of the n-type region. Given the n-type doping densities above and demonstrated degenerate emitters on, e.g., Si elongated structures as small as 100 nm, the lower limit for the radius of the elongated structures can be about 136-436 nm for $N_d=10^{18}$-$10^{16}$ cm$^{-3}$, respectively.

In some embodiments, the degenerate p-type sheath can be connected electrically to a second semiconductor, which is n-type using the optionally, but depicted, transparent conductor 40 (see, e.g., FIG. 1A). This contact should be ohmic to both the photocathode and photoanode. The photoanode conformally coats the transparent conductor and is in direct contact with the electrolyte, forming either a semiconductor-liquid junction or a buried p$^+$n-junction near the solution interface.

Catalysts 50 are connected electrically to the semiconductor to improve the rates of the chemical reactions and device efficiency. As described herein the catalyst may be in contact with a single Si "core" elongated structure or may be in part of a multi-layer semiconductive PV design. In the multi-layer semiconductive designs, the first semiconductor exposed to sunlight possesses a larger band gap than the inner semiconductor. This arrangement allows below-band gap light to be transmitted through the outer semiconductor to the smaller-band gap semiconductor where it can be absorbed (e.g., Si, whose bandgap is 1.1 eV). Because the semiconductors are also optically in series, this enables current matching between the semiconductors. Extensive material choices exist for both the anode and cathode. For example, such materials include, but are not limited to, Alternative materials include, but are not limited to a-Si, Ge, GaAs, GaP, CuInGaSe$_2$, CdZnSnSe, WSe$_2$, MoS$_2$, WS$_2$, ZrS$_2$, FeS$_2$, SiP, SiP$_2$, Cd$_7$P$_{10}$, GeS, Sb$_2$S, CuGaSe$_2$, Ag, GeSe$_2$, AgInS$_2$, ZnSiP$_2$, ZnSiAs$_2$, ZnGeP$_2$, ZnGeAs$_2$, CuGeP$_2$InP, CdTe, CdSe, CdS, TiO$_2$, WO$_3$, SnO$_2$, ZnO, CuO, CuO$_2$, BiVO$_4$, Fe$_2$O$_3$, (GaN)$_x$(ZnO)$_{1-x}$, ZnS, InGaN, GaNAs, GaInNAs, GaNP, AlGaAs, AlGaNAs, ZnSnN$_2$, ZnSnP$_2$, Cu$_2$ZnSnS$_4$, ZnOSe, ZnP$_2$, Zn$_2$P$_3$, SrTiO$_3$, BaTiO$_3$, In$_2$O$_3$, InVO$_4$, InNbO$_4$, InTaO$_4$, TaON, TiON, PbMo$_{1-x}$Cr$_x$O$_4$, doped TiO$_2$ (dopant=N, C, (Cr, C), (Mo, C), (W, C), (V, N), (Nb, N), (Ta, N), (Zr, S), (Hf, S), (2Nb, C), (2Ta, C), (Mo, 2N), (W, 2N), (Ta, P), (Nb, P), (Zr, Se), (Hf, Se)), P3HT:PCBM, PTB4:PCBM, and PTB1:PCBM.

Where embodiments comprise a plurality of tandem semiconductive material of differing bandgaps, the wider band-gap material typically is a III-V material. In another embodiment, the wider band-gap material comprises a II-VI material. In yet a further embodiment, the III-V material is selected from the group comprising AlP, GaP, InP, GaInP, AlGaP, AlNP, GaNP, InNP, AlGaInP, AlPN, GaPN, InPN, AlGaNP, GaInNP, AlInNP and AlGaInNP. For example, an outer (second) semiconductive material can comprise a semiconductive material selected from the group consisting of GaAs, GaP, GaAs$_x$P$_{1-x}$, Al$_x$Ga$_{1-x}$, As, Al$_x$Ga$_{1-x}$As$_y$P$_{1-y}$, In$_x$Ga$_{1-x}$As, In$_x$Ga$_{1-x}$P, In$_x$Ga$_{1-x}$As$_y$P$_{1-y}$, Al$_x$In$_{1-x}$As$_y$P$_{1-y}$, Al$_x$Ga$_{1-x}$As$_y$N$_z$P$_{1-y-z}$, In$_x$Ga$_{1-x}$As$_y$N$_z$P$_{1-y-z}$, Zn$_3$P$_2$, Zn$_3$S$_2$, and ZnP$_x$S$_{1-x}$ (0≤x≤1, 0≤y≤1, 0≤z≤1, 0≤y+z≤1) and any of the semiconductive materials set forth elsewhere herein. In a specific embodiment, the wider band-gap coating material comprises GaP or WO$_3$. In one embodiment, the wider band-gap coating material comprises a II-VI material. In a further embodiment, the II-VI material is selected from the group consisting of ZnO, CdSe, CdS, CdTe, ZnO, ZnSe, ZnS, ZnTe, CdZnTe, HgCdTe, HgZnTe, and HgZnSe. In yet another embodiment, the wider band-gap material is coated to about 100 nm to about 20 micrometers thick. Furthermore, it should be recognized that any p-type doped regions of the semiconductive material for any portion of the device schematically presented in FIG. 1, 2 or 3 could be changed to n-type and vice versa.

The membrane 30 can be any number of materials. An ionomer membrane can be deposited conformally around the circumference of the semiconductive structure (e.g., the wires) forming an extended, continuous network between all wires in the array. This membrane serves to separate chemical products produced on each side of the membrane while providing ionic transport through the membrane. Many materials meet these requirements for a membrane. For example, such membrane materials include, but are not limited to, Nafion®, Graphene, Nafion®/SiO$_2$, Nafion®/ZrP, Nafion®/Pd, Nafion®/polyvinyl alcohol, Nafion®/montmorillonite, Nafion®/Nafion®-PVDF/Nafion®, Sulfonated Polyphosphazene-PBI, Pd, PEO/KOH, Poly(Ech-co-EO), PVA/KOH, PVA/PEch/KOH, PVA/TEAC/KOH, PVA/PAA, PVA/PEO/KOH, Chitosan, PBI/KOH, PEG-[Si(OCH$_3$)$_3$]$_2$(+), PVA-[Si(OCH$_3$)$_3$]$_2$(+), GMA/γ-MPS, Alkoxysilane/acrylate or epoxy alkoxysilane, Poly(VBC-co-γ-MPS), PPO-Si(OCH$_3$)$_3$(+), PMA-SiO$_2$, PVA/TiO$_2$/KOH, PVA/TiO$_2$, PVA/ZrO$_2$/KOH, PVA/PEI cross-linked DBE, PVA/poly(1,3-diethyl-1-vinylimidazolium bromide), PVA/PAAm, PVA/poly(acrylonitrile-co-2-dimethylaminoethyl-methacrylate), Quaternized Ech/PAN/DABCO, Poly(ethylene)/poly(St-co-DVB), LDPE/PVB, PP/PVB, PE/PVB, PVDF/PVB, ETFE/PVB, PETE-FEP/PVB, ETFE-FEP/PVB, PS/DVB, LDPF(IPN), LDPE/HDPE(IPN), PS-b-EB-b-PS, PS/butadiene, YSZ, Bi$_2$O$_3$, Bi$_2$O$_3$—Y$_2$O$_3$, ZrO$_2$—Y$_2$O$_3$, ScSZ, CYO, CGO, CSO, (La, Sr) (Ga, Mg)O$_{3-x}$, Ba$_2$In$_2$O$_5$, La$_2$Mo$_2$O$_9$, M$_{10}$(XO$_4$)6O$_{2+y}$ (M=rare earth or alkaline earth metal, X=P, Si or Ge). Possible configurations for the membrane include, but are not limited to, a continuous material at the base of the microwires or an alternating checkerboard/snakeskin arrangement where the light absorbers and ion-exchange membrane are not in the same physical location, but rather are arranged side-by-side, for example.

FIGS. 2 and 3 depict two examples of a photoelectrosynthetic hydroiodic-acid splitting microwire device of the disclosure. In the embodiment, depicted in the figures, the microwires are partially embedded in an ionomer membrane with electroctalysts deposited on the microwire sufaces.

In the embodiment depicted in FIG. 2, each microwire is a p-type Si with a thin n$^+$ conformal emitter shell and Pt electrocatalysts deposited on the microwire array sidewalls and tops, as the cathode catalysts, and on the microwire backsides, as the anode catalysts. Nafion® is used as the proton-exchange membrane.

The Si microwires can be grown by a chemical-vapor deposition (CVD), vapor-liquid-solid (VLS) growth process using a Si(111) growth substrate. The substrate used to grow the wires is polished on one side, p-type doped to a resistivity <10 mOhm-cm, and possesses a 300-600 μm thermal oxide, patterned photolithographically, such that a growth catalyst (e.g., copper) can be deposited in a 3×7 μm array of holes in the oxide. Cu, Ni, Pt, or Al may be used as a catalyst for Si structure growth. Cu is, unlike Au, an inexpensive, earth-abundant material, and, therefore, of particular interest for such embodiments. Although Cu is more soluble in Si than Au and is also a deep trap, Si solar cells are more tolerant of Cu contamination than of Au, and thus diffusion lengths of at least microns even in the case of Cu catalyzed growth can be expected. As discussed above, other growth catalysts may be used to facilitate the growth of the Si elongated structure in the array. Nominally identical elongated structural arrays may be obtained when Cu, Ni, Pt, or Al (or other Si growth catalyst metals) are used as the VLS growth catalyst instead of Au. The microwires are then grown from gaseous precursors (e.g., $SiCl_4$ and $BCl_3$) under reducing conditions at 1000° C. The resulting Si microwire core can be moderately doped p-type ($N_d$=$10^{16}$-$10^{18}$ cm$^{-3}$); following published cleaning and fabrication steps a thin, degenerately doped n-type emitter ($N_a$>$10^{18}$ cm$^{-3}$) radial sheath can be generated, forming a p-type|n-type (pn) junction. A Nafion® ionomer membrane can then be spin cast into the wire array from an N,N dimethylformamide solution and cured at 150° C. Pt electrocatalysts are then deposited potentiostatically (E=−300-−400 mV vs. SCE) on the Si microwires via photoelectrochemical deposition using >850 nm light for 100-200 mC/cm$^2$. Nafion-embedded Si microwires are then mechanically removed from the substrate and immediately 5 nm of Pt can be deposited on the backsides via electron-beam evaporation. The completed device is depicted schematically in FIG. 2a and the potential-position diagram is shown as FIG. 2b. The apparatus used to measure this type of system is described below.

In FIG. 3 each microwire is n-type Si either methylated using a two-step chlorination-alkylation procedure or coated with a thin p+ conformal emitter shell and Pt electrocatalysts deposited on the microwire array sidewalls and tops, as the anode catalysts, and on the microwire backsides, as the cathode catalysts. Nafion® is used as the proton-exchange membrane.

The Si microwires can be grown by a CVD-VLS growth process using a Si(111) growth substrate. The substrate is first polished on one side, n-type doped to a resistivity <10 mOhm-cm and prepared with a 300-600 μm thermal oxide layer, patterned photolithographically such that a growth catalyst (e.g., copper) can be deposited in a 3×7 μm array in holes in the oxide. Cu, Ni, Pt, or Al may be used as a catalyst for Si structure growth. Cu is, unlike Au, an inexpensive, earth-abundant material, and, therefore, of particular interest for such embodiments. Although Cu is more soluble in Si than Au and is also a deep trap, Si solar cells are more tolerant of Cu contamination than of Au, and thus diffusion lengths of at least microns even in the case of Cu catalyzed growth can be expected. As discussed above, other growth catalysts may be used to facilitate the growth of the Si elongated structure in the array. Nominally identical elongated structural arrays may be obtained when Cu, Ni, Pt, or Al (or other Si growth catalyst metals) are used as the VLS growth catalyst instead of Au. The microwires are grown from gaseous precursors (e.g., $SiCl_4$ and $PH_3$) under reducing conditions at 1000° C. The resulting Si microwire core can be moderately doped n-type ($N_d$=$10^{16}$-$10^{18}$ cm$^{-3}$); a thin, degenerately doped p-type emitter ($N_a$>$10^{18}$ cm$^{-3}$) radial sheath is then generated, forming a pn junction. Furthermore, with n-type microwires there are two options: a radial p+ emitter or surface methylation of the bare n-type microwires. For either of these, n-type microwires also include the growth of an n+ region at the axial base of the microwire. Alternatively, the microwire sidewalls and top are methylated using a two-step chlorination-alkylation procedure. Nafion® ionomer membrane is then spin cast into the wire array from N,N-dimethylformamide solutions and cured at 150° C. under vacuum. Pt electrocatalysts are then deposited potentiostatically (E=−1 V vs. SCE) on the Si microwires via electrochemical deposition for 100-200 mC/cm$^2$. Nafion® embedded Si microwires are then mechanically removed from the substrate and a metal is electrolessly or electron-beam evaporated on the backsides to form a low-resistance, ohmic contact. An alternative option to form a low-resistance contact is by generation of a back-surface-field before generating the pn junction. This can be accomplished by thermal annealing to diffuse dopants from the growth substrate into the base of the Si microwires, or by varying the doping profile through altering the concentration of dopants in the CVD gas stream during microwire growth. This would be followed by either electron-beam evaporation of 5 nm of Pt or electroless Pt deposition deposited on the microwire backsides. The completed device is shown schematically in FIG. 3a and the potential-position diagram is shown as FIG. 3b.

In one embodiment, in a hydroiodic-splitting cell operating under acidic aqueous conditions, the membrane can be a proton exchange membrane such as Nafion®. Mechanical support provided by the membrane enables physical device removal from the growth substrate resulting in a freestanding, flexible PEC device. Device operation follows solid-state drift and diffusion of electrons and holes where a junction, drives charge separation under illumination. The resulting photopotential is used to affect chemical reactions such as hydrogen evolution via HI splitting. Under solar illumination, photogenerated electron-hole pairs are created in the elongated structure cores. Photogenerated carriers in the elongated structure core are separated by the electric field in the radial junction. The photogenerated electrons in the core material diffuse axially to the wire base where they are collected at the reductive catalyst to perform the fuel-forming half reaction. The photogenerated holes in the photoanode are collected at the catalyst where they perform the other fuel-forming half reaction.

The disclosure provides photocathode and photoanode devices for HI splitting to form $H_2$. The photoanode and photocathode may comprise arrays of semiconductive elongated structures of the disclosure comprising a metal catalyst on the semiconductive elongated structure, as described herein. In one embodiment, the elongated structures are an n- or p-Si material having a layer of an oppositely doped emitter layer. The catalysts disposed on the semiconductive structures are used to drive the oxidation or reduction reactions at low overpotentials. In one embodiment, the catalyst is a platinum catalyst. Typically the catalysts coated on the semiconducting structures/substrates do not block or inhibit light energy from contacting the semiconducting array or substrate. Accordingly, the catalyst should cover from about 1-99% of the surface area unless sufficiently transparent to allow light penetration to the underlying semiconducting substrate. The high aspect-ratio of the semiconductor elongated structure electrodes allow for the use of low cost, earth abundant materials without sacrificing energy conversion efficiency due to the orthogonalization of light absorption and charge-carrier collection. Additionally, the high surface-area design of the elongated structure-based semiconductor array electrode inherently lowers the flux of charge carriers over the rod array surface relative to the projected geometric surface of the photoelectrode, thus lowering the photocurrent density at the solid/liquid junction and thereby relaxing the demands on the activity (and cost) of the electrocatalysts. A flexible composite polymer film may be used to allow for electron and ion conduction between the photoanode and photocathode while simultaneously preventing mixing of the gaseous products. That is, the elongated structure arrays may be embedded in flexible, polymeric membrane materials, allowing the possibility of roll-to-roll system assembly. Separate polymeric materials may be used to make electrical contact between the anode and cathode, and also to provide structural support. Interspersed patches of an ion conducting polymer may be used to maintain charge balance between the two half-cells.

The table below serves as a running guideline for the device parameters and thus the material to help rationalize the choice of materials and chemicals and chemical reaction. The table summarizes the performance parameter for photovoltaics relevant to photoelectrosynthetic systems (i.e., photovoltages), as well as unavoidable losses present in photoelectrochemical devices for hydroiodic acid splitting:

|      | $E_{bg}$ (eV) | $V_{oc}$ (V) | $V_{mpp}$ (V) | $-\eta_{cat}$ (V) | $-V_{rf(o)}$ (V) | $-V_{cu}$ (V) | $E(H_2,I_3^-/HI)$ |
|------|------|------|------|------|------|------|------|
| Min. | 1.11 | 0.71 | 0.63 | 0.53 | 0.44 | 0.43 | 0.15 |
| Max. | 1.90 | 1.11 | 1.03 | 0.98 | 0.92 | 0.92 | 0.95 |

Min./Max. = minimum/maximum value for the specific column
$E_{bg}$ = bandgap energy of the semiconductor[2]
$V_{oc}$ = open-circuit photovoltage[2]
$V_{mpp}$ = photovoltage at the point of maximum power generation for the device[2]
$\eta_{cat}$ = sum of the overpotentials due to anodic and cathodic catalysis
$V_{rf(o)}$ = photovoltage loss due to the roughness factor, which is a function of the diode quality factor
$V_{cu}$ = photovoltage loss due to the charge neutrality requirement (e.g. the ohmic potential drop in solution due to ionic drift)
$E(H_2,I_3^-/HI)$ = potential of the hydroiodic-acid-splitting reaction, at room temperature and 1 atm $H_2$[3]

In a particular embodiment, the photocathode may comprise vertically (or near vertically) aligned elongated structure arrays made of macroporous p-Si <100>. In another embodiment, the photoanode and photocathode components may be electrically, and ionically, interconnected through, but physically separated by, a flexible composite polymer film (e.g., an ionomer membrane). Further, multi-component membranes, composed of polymeric materials that exhibit desired mechanical pliability, electronic conductivity, and ion permeability properties for a feasible water electrolysis system may be used. Specifically, polypyrrole may be used to make electrical contact between the anode and cathode, while poly(dimethylsiloxane) (PDMS) may be used to provide structural support for the elongated structure arrays. For proton conduction in a cell operated under acidic conditions, Nafion® may be employed, whereas vinylbenzyl chloride modified films of poly(ethylene-co-tetrafluoroethylene) (ETFE), or amine-modified sulfonyl fluoride Nafion® precursors, may be used for hydroxide conduction in a cell operated under alkaline conditions.

In yet another embodiment, a catalyst such as a hydrogen or iodide evolution catalyst can be coated on the device to facilitate, for example, $H_2$ production from HI. The catalyst can be any number of catalysts useful as hydrogen evolution. For example, suitable hydrogen evolution catalyst can be selected from the group consisting of Pt, Co, Cu, Fe, $MoS_x$ where x is nominally 2, but may be sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW and NiWPCu. For example, photocathode side of the membrane can be coated with a hydrogen reduction catalyst such as Pt, or other catalysts that are needed to produce the desired fuels. Where Si elongated structures extend out from the membrane on the photocathode side the elongated structure can be coated with a hydrogen evolution catalyst (see, FIGS. 1, 2 and 3). Similarly, the photoanode side of the membrane comprises the tandem-radially integrated elongated structure arrays. On the photoanode side the elongated structures are coated with the same of different catalysts. (see FIGS. 2, 3, and 4).

The following examples are meant to illustrate, not limit, the disclosed invention.

EXAMPLES

A device as depicted in FIG. 2 was made as an example of the photoelectrosynthetic hydroiodic-acid splitting microwire device. The Si microwires were grown by a CVD-VLS growth process using a Si(111) growth substrate. The substrate was polished on one side, p-type doped to a resistivity ~4 mOhm-cm, and possessed a ~500 μm thermal oxide, patterned photolithographically such that copper was deposited in a 3×7 μm array in holes in the oxide. The photolithographic process was as follows: spin-coat hexamethyldisiloxane onto the oxide layer on the Si wafer to signalize the surface, followed by Shipley's S1813 photoresist with a spin ramp protocol of 10 sec at 500 RPM, 60 sec at 3000 RPM, followed by edge bead removal; soft bake for 2 min at 115° C. on a hot plate; pattern holes in the photoresist using a chrome mask with a periodic array of holes (~3 μm in diameter and center-to-center distance of 7 μm) and ~10 sec exposure using UV light from a Karl Süss mask aligner; develop with MF-319 developer for 60 sec; hard bake for 30 min at 115° C.; perform a buffered HF etch for ~4 min followed by a rinse with deionized water; electron-beam evaporation of ~500 nm high-purity Cu (6N); liftoff using acetone followed by a rinse with acetone, isopropanol, and deionized water. The microwires were grown using wafer pieces ~2×3 cm from gaseous precursors, $SiCl_4$ and $BCl_3$, at flow rates of 50 sccm and 2.5 sccm, respectively, under reducing conditions of $H_2$, at 450 sccm, at 1000° C. The resulting Si microwires were ~80 μm long and ~2 μm in diameter with a core that was moderately doped p-type ($N_d$=5×10$^{16}$ cm$^{-3}$); following published fabrication steps the wires were cleaned, processed, and a thin, degenerately doped n-type emitter ($N_a$=10$^{19}$ cm$^{-3}$) radial sheath was generated, forming a p-type|n-type (pn) junction, using Saint-Gobain PH-900 diffusion doping wafers. A Nafion® ionomer membrane was then spin cast into the wire array from N,N-dimethylformamide solutions (8 wt %) at 1000 RPM for ~15 sec followed by 40 min cure in a vacuum oven at 60° C. and then 20 min cure at 150° C. on a hot plate; this was repeated 3 times.

Electrodes were fabricated out of these samples (~1.5 cm×~1.5 cm) by scratching an InGa eutectic ohmic contact into the backside of the growth substrate, painting on Ag paint to a large coiled tinned Cu wire in a glass pyrex tube (6 mm ID), and securing with black nail polish (Sally Hansen, Xtreme Wear, 28 Black Out). Pt electrocatalysts were then deposited potentiostatically (E=−300−−400 mV vs. SCE) from a 5 mM $K_2Pt^{II}Cl_4$ aqueous electrolyte containing 1 M LiCl, on the Si microwires via photoelectrochemical deposition using >850 nm light for 100-200 mC/cm$^2$. Nafion®-embedded Si microwires were then mechanically removed from the substrate using a Teflon-coated razor blade or carbide blade and immediately 5 nm of Pt was deposited on their backsides via electron-beam evaporation under planetary rotation conditions. The completed device is depicted schematically in FIG. 2a; the potential-position diagram is shown as FIG. 2b.

The apparatus used to measure the performance of the device shown in FIG. 3 was fabricated from standard glass cuvettes and machined pieces of acrylic, plastic, and Viton®. The acrylic holder was fashioned to be positioned within an ultraviolet (UV)-to-visible (Vis) spectrophotometer as a direct, in situ and in operando probe of oxidation products (i.e. $I_3^-$). The base and holder of an HP-8452A UV-Vis diode-array spectrophotometer was modified to support the larger acrylic piece and position the bottom of the anode cell in the pathlength of the probe light. Such a sample holder can be fashioned for almost any UV-Vis spectrophotometer for this purpose. The utility of this measurement system and apparatus is that it can be used to detect any oxidation product that has a UV-Vis absorption profile. In theory the infrared, or another, spectral window can also be used to probe product formation, assuming the cuvettes are fashioned from the appropriate material and the product has a spectral signature in the desired probing region.

The device holder consists of two cuvettes (optical pathlength of 1 cm, square, and 2 mm, by 1 cm) each with a 3 mm hole drilled in one side and facing the interface between the cells. The cells are vertically offset such that the 2 mm×1 cm cuvette is positioned ~5 mm below the 1 cm square cuvette. The 1 cm square cuvette possesses a screw-top containing a Teflon®-backed silicone rubber septum, while the 2 mm×1 cm cell possesses a Teflon® stopper and a 'tiny' (~2.5 mm diameter) tapered joint. A Pt wire, with tinned Cu wire extension soldered into place, is inserted into the top of each septum/stepper, and securely affixed, for in situ generation of redox species. This allows variation of the solution redox potentials and electrochemical calibration of the product generation rates. Both cells have a 1.5×8 mm Teflon®-, or glass-, coated cylindrical stirbar inside; an inductive stirrer is located on the 1 cm side of each cuvette to supply forced convection to the electrolyte in each compartment (only one stirrer is shown). Two Viton (or Kalrez) sheets, each with a 2-3 mm hole in them and being ~1 mm thick, are sandwiched between the cuvettes. The free-standing device is located in between these sheets. The apparatus is positioned within a custom-made, two-piece acrylic sample holder held together by two 10-32 screws with washer-containing wing nut ends. The large acrylic block has a hole bore in the side as a feed-through for a fiber optic from an ELH W-halogen lamp housing for solar-simulated illumination. There is also a small ledge at the bottom that supports the 1 cm square cuvette. An optional feed-through is located at a slight angle for an endoscope/borescope allowing in situ visual monitoring of the $H_2$-evolving cathode side of the device on an external screen. The cathode-side septum can be fashioned with two Teflon® tubes used to flow inert gas into the headspace out to an $H_2$ detection system (e.g., mass spectrometer, Unisense $H_2$ sensor) or can be pierced with a gas-tight syringe for direct injection of headspace products into a gas chromatograph with detector (e.g., thermal conductivity detector (TCD)) or mass spectrometer. Additional in situ and in operando features include, but are not limited to, a thermostat to control and measure the temperature of the electrolyte, a pH meter/probe, and flow control to circulate electrolyte to/from the reaction vessels for reaction/detection and overall mixing the electron source. In addition, many fuel-forming half reactions can be performed with this design (e.g., possible fuels include $H_2$, $CH_3OH$, $CH_2O$, $CH_4$, $CH_2O_2$, CO, $C_2H_4$, $C_2H_5OH$, higher hydrocarbons and reduced $N_2$ species). Extensive material choices exist for the semiconductor and the reductive catalyst to perform the $H_2$ evolution half-reaction, and the oxidative catalyst to take electrons from the electron source. A variety of different reactant sources can be used so long as the potential difference in the fuel-forming reaction and electron source are in the ranges listed above.

Although a number of embodiments and features have been described above, it will be understood by those skilled in the art that modifications and variations of the described embodiments and features may be made without departing from the teachings of the disclosure or the scope of the invention as defined by the appended claims.

What is claimed is:

1. A device for generating hydrogen gas comprising:
   a chamber compartmentalized to have a first subchamber and a second subchamber;
   an ionomer membrane sealably separating the first subchamber and second subchamber;
   a plurality of elongated structures comprising an Si material extending through the ionomer membrane and having the following parameter(s):
   a bandgap energy of about 0.80 to 1.90 eV,
   each elongated structure having a first end and a second end,
      wherein the first ends of the plurality of elongated structures are n-Si comprising a $p^+$ emitter layer and extend into the first subchamber and wherein the second end of the plurality of elongated structures are undoped n-Si and extend into the second subchamber; and
   catalyst disposed on the surface of the first end of elongated structures in the first subchamber, wherein the catalyst on the first end of elongated structure performs the following half reaction:

$$3I^- \rightarrow I_3^- + 2e^-,$$

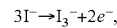

catalyst disposed on the second end of elongated structures in the second subchamber, wherein the catalyst on the second end of elongated structure performs a half-reaction:

$$2H^+ + 2e^- \rightarrow H_2,$$

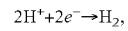

when exposed to light.

2. The device of claim 1, wherein the potential of an HI solution is varied from 150 mV to 950 mV through dilution of fuming aqueous HI, addition of various concentrations of $I_2$ to the solution, and/or adding iodide salt or another acid source to dilute HI solution.

3. The device of claim 1, wherein the elongated structure has a dimension comprising 500 nm to about 5 micrometers in diameter and about 1 micrometer to 1 mm in length or wherein the elongated structure has a mean diameter less than 1 micrometer and a length of less than 1 micrometer and an aspect ratio of greater than 1.

4. The device of claim 1, wherein the elongated structure has an aspect ratio greater than 1.

5. The device of claim 1, wherein the elongated structure is substantially embedded in a membrane comprising an ionomer material.

6. The device of claim 5, wherein the elongated structure embedded in the membrane extending from and/or through a first surface to and/or through a second surface of the membrane.

7. The device of claim 1, wherein one of the first or second end or both the first and second end of the elongated structure are coated with a catalyst.

8. The device of claim 1, wherein the catalyst is Pt.

9. The device of claim 1, wherein the device comprises Si microwires embedded in the ionomer membrane, wherein the Si microwires are doped or undoped and are coated with a Pt catalyst on both sides of the ionomer membrane.

10. A method of generating $H_2$ from HI comprising contacting the device of claim 1 with HI under illumination.

* * * * *